(12) United States Patent
Hollemann et al.

(10) Patent No.: US 6,266,358 B1
(45) Date of Patent: Jul. 24, 2001

(54) DIODE-PUMPED SOLID-STATE LASER WITH AN EXCHANGEABLE PUMPING MODULE

(75) Inventors: Guenter Hollemann; Karin Pachomis; Uwe Kutschki, all of Jena (DE)

(73) Assignee: Jenoptik Aktiengesellschaft, Jena (DE)

( * ) Notice: Subject to any disclaimer, the term of this patent is extended or adjusted under 35 U.S.C. 154(b) by 0 days.

(21) Appl. No.: 09/341,204
(22) PCT Filed: Nov. 4, 1998
(86) PCT No.: PCT/EP98/07031
 § 371 Date: Aug. 23, 1999
 § 102(e) Date: Aug. 23, 1999
(87) PCT Pub. No.: WO99/25046
 PCT Pub. Date: May 20, 1999

(30) Foreign Application Priority Data

Nov. 7, 1997 (DE) .............................. 197 49 328

(51) Int. Cl.[7] .............................. H01S 3/091; H01S 3/09; H01S 3/04
(52) U.S. Cl. .............................. 372/75; 372/69; 372/71; 372/72; 372/34
(58) Field of Search .............................. 372/35, 69, 75, 372/92; 356/139.05, 139.06

(56) References Cited

U.S. PATENT DOCUMENTS 4,584,655 * 4/1986 Funk et al. .............................. 364/550
5,052,010 * 9/1991 Blumentritt et al. .............................. 372/65
5,475,702 12/1995 August, Jr. et al. .

FOREIGN PATENT DOCUMENTS 44 11 599  10/1995  (DE) .

OTHER PUBLICATIONS

Compact 170 W continuous–wave diode pumped Nd;YAG rod laser with a cusp shaped reflector, T. Brand, Jan. 9, 1995, Optic Letters vol. 20, p. 1776.*

English Abstract of DE 44 11 599.

* cited by examiner

Primary Examiner—Teresa M. Arroyo
Assistant Examiner—James Menefee
(74) Attorney, Agent, or Firm—Reed Smith LLP

(57) ABSTRACT

The invention relates to a diode-pumped solid-state laser (DSSL) comprises a pumping light source having a diode stack. The inventive laser also comprises a laser rod and a pumping cavity, whereby the pumping light source accommodated in a separate housing can be exchanged as a pumping module with simple handles. As a result, the pumping light source is protected from electrostatic discharge of the diodes, mechanical stress and from contamination. Given that it is possible to accommodate alternative pumping light sources of varying pumping capacities in the pumping module, the user can exchange the pumping module when the pumping module is worn as well as when additional power is required.

7 Claims, 4 Drawing Sheets

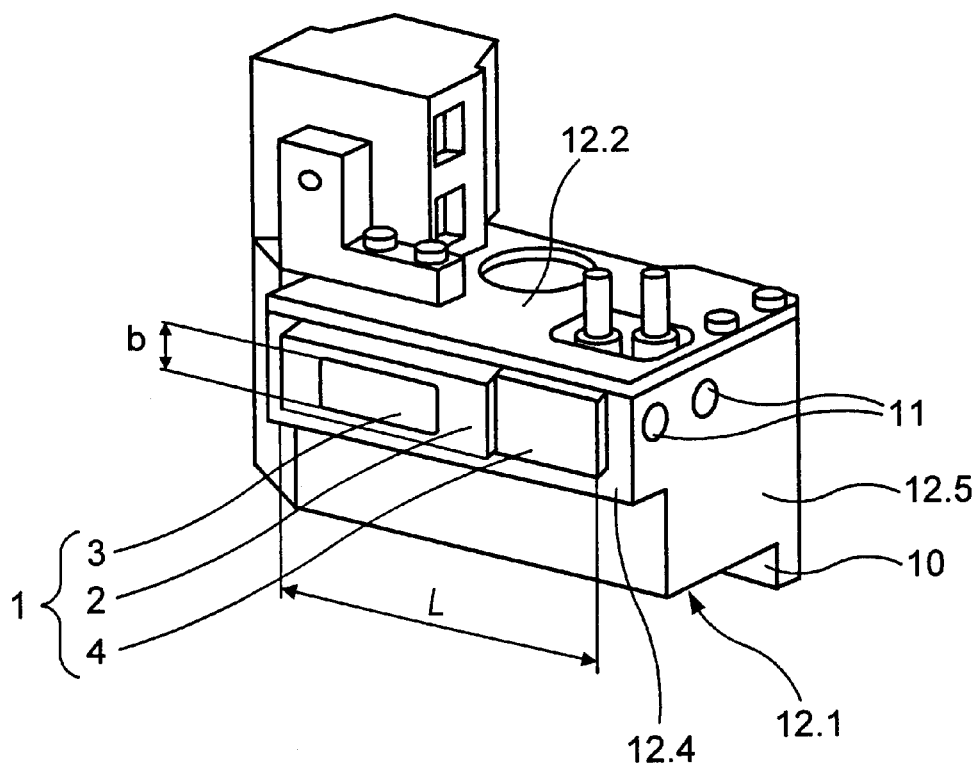
F I G. 1

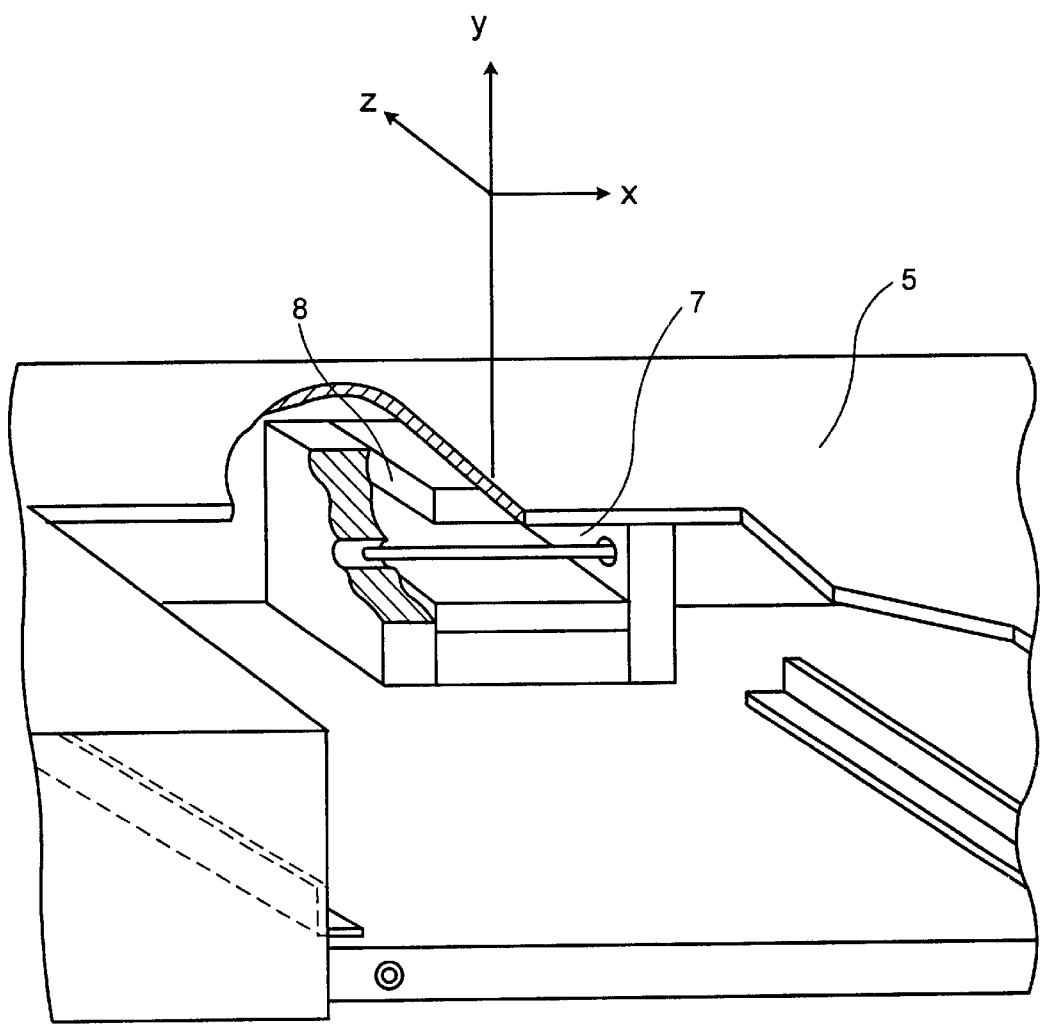
F I G. 3

DIODE-PUMPED SOLID-STATE LASER WITH AN EXCHANGEABLE PUMPING MODULE

BACKGROUND OF THE INVENTION

1. Field of the Invention

The invention relates to a diode-pumped solid-state laser (DSSL) with a pump light source. The light source has a diode stack, with a laser rod and a pump cavity. The center of the emitting face of the diode stack has a defined position in space relative to the laser rod.

2. Description of the Related Art

Such a DSSL is disclosed by the publication "Compact 170 W continuous-wave diode-pumped Nd:YAG rod laser with a cusp-shaped reflector" by T. Brand (Optic Letters Vol. 20, p. 1776, 01.09.1995).

Because of their significant advantages, DSSLs are taking over to an increasing extent from lamp-pumped lasers in many fields of application. Through the technological possibility of arranging a multiplicity of laser diodes in a row (linear diode array) or a plurality of such linear diode arrays above one another as a stack (diode stack), it is possible to form pump light sources with an extremely wide range of pump power. Further, DSSLs have high electro-optical efficiency, long life, better beam quality because of the smaller heat input into the active element, and such systems can be designed more compactly because of their low thermal dissipation.

There are, however, a few disadvantages.

The most significant disadvantage results from the differing divergence of the diode radiation in the direction of the fast axis (perpendicular to the pn junction) and in the direction of the slow axis (parallel to the pn junction) of the laser diodes. The radiation from the emitting face of a diode stack with a length equal to the linear diode array length and a width equal to the stack height is correspondingly directional radiation with a divergence angle of about 15° across the width (slow axis) and about 50° across the length (fast axis) of the emitting face (pump radiation).

In order to obtain a high input coupling efficiency for the pump radiation, the latter must be adjusted in terms of its direction and position with respect to the active element to be pumped, or where applicable with respect to input coupling optics which may also be a pump cavity. This means, in practical terms, that the pump light source must be arranged in a particular relative position with respect to the active element or with respect to the coupling optics. This requirement is the main reason why the pump light source in a DSSL is not easily interchangeable, as is usual in the case of lamp-pumped solid-state lasers and is regarded as a particular advantage.

A further disadvantage is the electrostatic sensitivity of the diodes, which are straight away irreparably damaged by an electrostatic discharge. There are also stringent requirements on the accuracy of the temperature of the cooling water and the cleanliness of the environment. Condensation of water on the diode likewise leads to their more rapid degradation.

The aforementioned basic requirements, in particular the need to adjust the defined relative position, make simple interchanging of the pump light source impossible in the case of most known DSSL arrangements.

Transverse pumping of the active element without coupling optics, because of the pronounced divergence of the pump radiation in the direction of the fast axis, is only possible with individual linear diode arrays which are arranged radially distributed close around the active element. The number of linear diode arrays can be increased if a cylindrical lens is arranged as coupling optics in front of each of them, for example, in the linear array direction.

In such solutions, the pump light source is correspondingly a sum of many separately arranged individual linear diode arrays, each linear diode array needing to be adjusted on its own with respect to its coupling optics. Design solutions in which the user can himself carry out interchanging are not possible.

For longitudinal and transverse pumping, it is known to combine the radiation from individual or even a plurality of linear diode arrays using sometimes very complicated optics, and to shape it, in such a way that it can be coupled into an optical fiber.

DSSL arrangements with fiber-coupled linear diode arrays are for example known from U.S. Pat. Nos. 5,127, 068, 5,436,990 and 5,446,749. These systems are suitable for having design configurations such that the linear diode array with the coupling optics and the optical fiber are arranged in a compact pump module which, should need be, can be completely interchanged. Since, essentially, only the input coupling of the radiation from individual, or only a few, linear diode arrays into an optical fiber is possible, the possibility of scaling the pump power is very limited. Further, such pump modules are very expensive since they also contain complete coupling optics.

The article "Compact 170 W continuous-wave diode-pumped Nd;YAG rod laser with a cusp-shaped reflector" by T. Brand (Optic Letters Vol. 20, p. 1776, 01.09.1995) describes a transversely pumped DSSL in which the pump radiation is essentially reflected across a pump cavity into a laser rod. Using this pump cavity, as described by way of example in the article, it is possible to couple the pump radiation of a diode stack with a size of 1 cm (linear diode array length)×4.5 cm (stack height) into a laser rod with 4 mm diameter. This extreme stack height permits hitherto unknown scaling of the pump power using a single pump light source. In order to pump the laser rod effectively, the center of the emitting face of the diode stack should be arranged opposite the center of the laser rod and at a distance from the pump cavity such that it is maximally illuminated but without having a beam-limiting effect on the pump radiation.

The optical principle of coupling the pump-light radiation in through a reflecting pump cavity does not place such extremely stringent requirements on the accuracy of the adjustment of the pump light source as are made in the case of the known input coupling by means of transmissive input coupling optics. Further, such an arrangement is particularly advantageous because basically no changes need to be made to the design dimensions of the pump cavity, which may be configured as diffuse or specularly reflective and in different geometries, as a function of the desired pump power, which can be varied by means of the stack height.

THE OBJECT AND SUMMARY OF THE INVENTION

The primary object of the invention is to provide an arrangement for a transversally pumped DSSL which makes it possible to interchange the pump light source by simple handling operations and while being protected against electrostatic discharge of the diodes, mechanical stress and contamination. The intention is for this interchanging to be possible both in the case of wear by replacing with an equivalent pump light source, and when a different pump power is needed by replacing with a different pump light source.

According to the invention, this object is achieved for a DSSL with a pump light source having a diode stack, with a laser rod and a pump cavity, the center of the emitting face of the diode stack having a defined position in space relative to the laser rod or to the pump cavity, in that the pump light source is fitted in a separate casing in a defined position, and thus forms an interchangeable pump module, which, when inserted into the instrument casing of the DSSL, arranges the center of the emitting face of the diode stack in the aforementioned defined spatial position.

The invention will be explained in more detail below with reference to an illustrative embodiment.

BRIEF DESCRIPTION OF THE DRAWING

FIG. 1 shows a pump module which fits the embodiment according to FIG. 3, in a view facing the laser rod, FIG. 3 shows an embodiment of a DSSL according to the invention limited to the representation of the means essential for the description, without a pump module.

DESCRIPTION OF THE PREFERRED EMBODIMENTS

Figure 2:
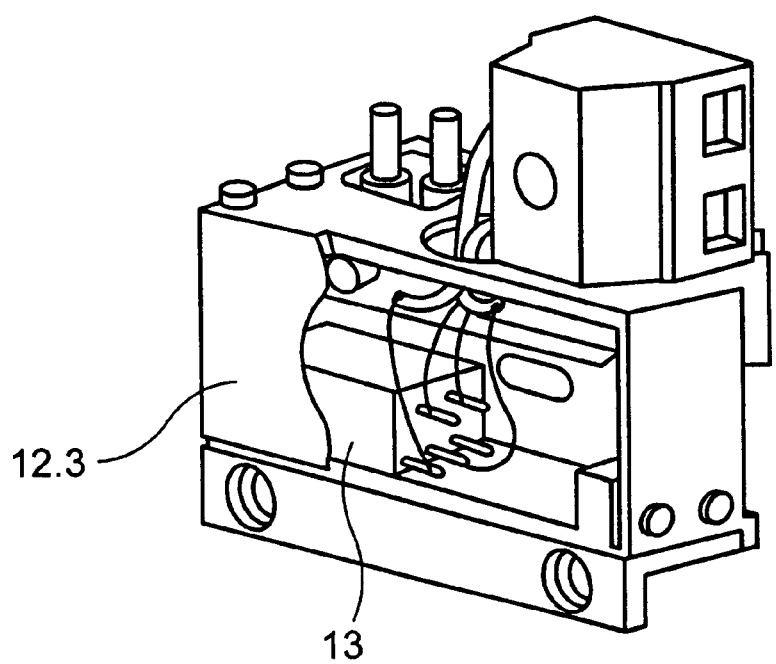
FIG. 2 shows the pump module represented in FIG. 1, in a view away from the laser rod.

The center piece of the pump module represented in FIG. 1 is formed by a pump light source 1 consisting of a diode stack 2 with an emitting face 3 and a cooling system 4.

The pump light source 1 is commercially obtainable in this form. According to different pump power, individual embodiments of this pump light source 1 differ in terms of the height of the diode stack 2, which is determined by the number of linear diode arrays arranged above one another. As a function of the differing diode stack height, the pump modules which differ in terms of pump power have a different length 1. The width b of the pump light source 1 is essentially determined by the linear diode array length and does not generally differ for the pump light sources 1 from a given manufacturer. In order for the center of the emitting face 3 to be in the required relative position with respect to the laser rod 7 or the pump cavity 8 after the pump module has been inserted into the DSSL arrangement, it must be arranged inside the pump module in a defined position with respect to the interface with the DSSL arrangement, which will be described below. Because of the differing length of the pump light sources 1 which are alternatively inserted into the pump module, there is a need for the possibility of displacement in one direction in space, which in the specific illustrative embodiment is catered for by the alignment screws 11, while there are fixed stops for the other directions in space. The pump module can also be given a design configuration so that such a possibility of displacement is also available in two or even three directions in space, if the intention is also for pump light sources 1 from different manufacturers with different external dimensions to be alternatively usable.

The casing of the pump module fulfills several functions.

It gives all the modules arranged inside, in particular the pump light source 1, mechanical protection on all sides and likewise protects the latter against contamination and moisture. In the region of the inserted pump light source 1, it has a window in the front wall 12.4 which is at least as large as the emitting face 3 of the most powerful pump light source 1 that may be used. Further, the cover 12.2 of this casing contains an opening through which the water input and output adapters protrude. Also on the cover 12.2, there is a jack for the electrical connection of the pump module.

Figure 4:
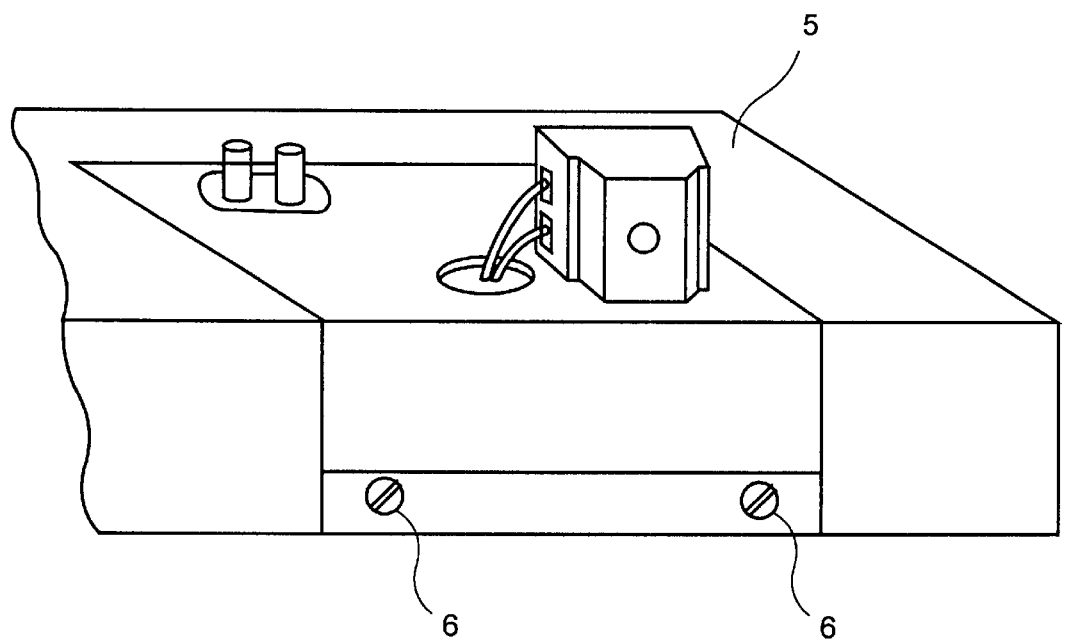
FIG. 4 shows the embodiment represented in FIG. 3 with a pump module.

The external shape of the pump module and its dimensions are chosen in such a way that the cover 12.2 and the rear wall 12.3 form, after insertion to a given degree into the instrument housing 5 of the DSSL, a uniformly closed structure with the latter (FIG. 4). Using the two screws 6, the pump module is fixed in this position. The jack as well as the water input and output are readily accessible.

A relay 13, which short-circuits the pump light source 1 outside the operating time in order to prevent an electrostatic discharge, is advantageously fitted inside the casing.

By the insertion of the pump module into the instrument casing 5, the emitting face 3 is brought into the desired relative position with respect to the laser rod 7 or to the pump cavity 8.

A prerequisite for this is, as described above, that the center of the emitting face 3 is adjusted during assembly of the pump module with respect to the faces forming the interface with the DSSL arrangement. In order to explain this interface, a Cartesian coordinate system with axes x, y, z has been introduced (FIG. 3). The coordinate origin is placed at the centroid of the laser rod 7 which the instrument casing 5 of the DSSL contains and with respect to which a pump cavity 8 is arranged in a defined way.

The interface between the DSSL arrangement and the pump module is defined in the three directions of the coordinate system via mechanical faces which are present.

A slideway which is present on the bottom face of the instrument casing and consists of two guide rails 9 embodies the interface on the part of the DSSL arrangement in the x and y directions, while the edge of this bottom face in the region between the guide rails 9 is used as a stop and embodies the interface in the z direction.

On the part of the pump module, the interface is formed by sliding faces on mutually opposite side walls 12.5 of the casing, the spacing of which coincides with that of the guide rails 9, and sliding faces on the adjoining regions of the bottom 12.1 in the x and y directions, as well as a stop 12 on the rear wall 12.3 in the z direction.

The insertion of the pump module via a slideway as far as the stop 10 is a particularly simple design solution for arranging the pump module in a defined fixed spatial position in the instrument casing 5 and therefore with respect to the laser rod 7 or to the pump cavity 8. This mechanical interface may also be configured in a different way using the knowledge of the person skilled in the art. The pump module may, for example, also be slid without a guide into a defined end position which is defined by three correspondingly arranged fixed stops, or the pump module latches into the desired end position with a snap-in connection.

What is claimed is:

1. A diode-pumped solid-state laser (DSSL) comprising:
   a pump light source having a diode stack, with a laser rod and a pump cavity, the center of the emitting face of the diode stack having a defined position in space relative to the laser rod or to the pump cavity;
   said pump light source, capable of having alternatively different external dimensions, being fitted in a separate instrument casing and thus forming an interchangeable pump module;

said instrument casing of the DSSL having an opening into which the pump module can be inserted and which is closed by slidable insertion of the pump module;

mechanical means being provided in the instrument casing of the DSSL and on the casing of the pump module which form a slidable mechanical interface for the relative position of the pump module with respect to the instrument casing of the DSSL;

said laser rod or the pump cavity having a unique adjusted relative position with respect to the mechanical means which the instrument casing contains; and said center of the emitting face being adjusted in a defined relative position with respect to the mechanical means which the instrument casing contains.

2. The DSSL according to claim 1, wherein the mechanical means in the instrument causing are a slideway consisting of two guide rails, and a casing edge running perpendicular thereto, and the mechanical means on the casing of the pump module are three mutually orthogonal faces on the casing itself.

3. The DSSL according to claim 1, wherein two sides of the casing of the pump module are matched to the instrument casing in such a way that they are freely accessible from outside after the pump module has been inserted into the instrument casing, and the pump module has all media connections, including water input and output and electrical connection, needed for operating the pump light source on these free sides.

4. The DSSL according to claim 1, wherein the casing of the pump module contains a relay by which the pump light source can be short-circuited outside the operating time in order to prevent electrostatic discharge.

5. A diode-pumped solid-state laser (DSSL) comprising:

a pump light source having a diode stack, with a laser rod and a pump cavity, the center of the emitting face of the diode stack having a defined position in space relative to the laser rod or to the pump cavity;

said pump light source, capable of having alternatively different external dimensions, being fitted in a separate instrument casing and thus forming an interchangeable pump module;

said instrument casing of the DSSL having an opening into which the pump module can be inserted and which is closed by insertion of the pump module;

mechanical means being provided in the instrument casing of the DSSL and on the casing of the pump module which form a mechanical interface for the relative position of the pump module with respect to the instrument casing of the DSSL;

said laser rod or the pump cavity having a unique adjusted relative position with respect to the mechanical means which the instrument casing contains; and said center of the emitting face being adjusted in a defined relative position with respect to the mechanical means which the instrument casing contains;

wherein the mechanical means in the instrument casing are a slideway consisting of two guide rails, and a casing edge running perpendicular thereto, and the mechanical means on the casing of the pump module are three mutually orthogonal faces on the casing itself.

6. The DSSL according to claim 5, wherein two sides of the casing of the pump module are matched to the instrument casing in such a way that they are freely accessible from outside after the pump module has been inserted into the instrument casing, and the pump module has all media connections, including water input and output and electrical connection, needed for operating the pump light source on these free sides.

7. The DSSL according to claim 5, wherein the casing of the pump module contains a relay by which the pump light source can be short-circuited outside the operating time in order to prevent electrostatic discharge.

* * * * *